United States Patent
Cordero et al.

(10) Patent No.: US 9,147,499 B2
(45) Date of Patent: *Sep. 29, 2015

(54) MEMORY OPERATION OF PAIRED MEMORY DEVICES

(71) Applicant: International Business Machines Corporation, Armonk, NY (US)

(72) Inventors: Edgar R. Cordero, Round Rock, TX (US); Timothy J. Dell, Colchester, VT (US); Girisankar Paulraj, Chennai (IN); Saravanan Sethuraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 259 days.

This patent is subject to a terminal disclaimer.

(21) Appl. No.: 13/769,472

(22) Filed: Feb. 18, 2013

(65) Prior Publication Data

US 2014/0164819 A1   Jun. 12, 2014

Related U.S. Application Data

(63) Continuation of application No. 13/707,675, filed on Dec. 7, 2012, now Pat. No. 8,996,935.

(51) Int. Cl.
| | |
|---|---|
| G06F 11/10 | (2006.01) |
| G11C 29/08 | (2006.01) |
| G06F 11/20 | (2006.01) |
| G11C 29/42 | (2006.01) |
| G11C 29/52 | (2006.01) |

(Continued)

(52) U.S. Cl.
CPC ............ *G11C 29/08* (2013.01); *G06F 11/2094* (2013.01); *G11C 29/42* (2013.01); *G11C 29/52* (2013.01); *G11C 5/04* (2013.01); *G11C 2029/0409* (2013.01); *G11C 2029/0411* (2013.01)

(58) Field of Classification Search
CPC .................................................... G06F 11/1076
USPC .................................. 714/763, 718, 754, 768
See application file for complete search history.

(56) References Cited

U.S. PATENT DOCUMENTS

| | | | |
|---|---|---|---|
| 4,468,729 A | 8/1984 | Schwartz | |
| 6,493,843 B1 | 12/2002 | Raynham | |

(Continued)

OTHER PUBLICATIONS

Cordero et al., "Memory Operation Upon Failure of One of Two Paired Memory Devices", U.S. Appl. No. 13/597,926, filed Aug. 29, 2012.

*Primary Examiner* — Fritz Alphonse
(74) *Attorney, Agent, or Firm* — Penny L. Lowry; Robert Williams

(57) ABSTRACT

A method and apparatus for operation of a memory module for storage of a data word is provided. The apparatus includes a memory module having a set of paired memory devices including a first memory device to store a first section of a data word and a second memory device to store a second section of the data word when used in failure free operation. The apparatus may further include a first logic module to perform a write operation by writing the first and second sections of the data word to both the first memory device and the second memory device upon the determination of certain types of failure. The determination may include that a failure exists in the word section storage of either the first or second memory devices but that no failures exist in equivalent locations of word section storage in the two memory devices.

6 Claims, 5 Drawing Sheets

(51) Int. Cl.
  *G11C 5/04*  (2006.01)
  *G11C 29/04* (2006.01)

(56) References Cited

U.S. PATENT DOCUMENTS

| | | | |
|---|---|---|---|
| 6,766,429 B1 | 7/2004 | Bland et al. | |
| 6,839,266 B1 | 1/2005 | Garrett, Jr. et al. | |
| 6,937,494 B2 | 8/2005 | Funaba et al. | |
| 7,103,746 B1 | 9/2006 | Kulick | |
| 7,137,020 B2 | 11/2006 | Gilstrap et al. | |
| 7,194,577 B2 | 3/2007 | Johnson et al. | |
| 7,370,238 B2 | 5/2008 | Billick et al. | |
| 7,447,974 B2 | 11/2008 | Klein | |
| 7,836,374 B2 | 11/2010 | Klein | |
| 7,840,860 B2 | 11/2010 | Alves et al. | |
| 7,949,850 B2 | 5/2011 | Swanson et al. | |
| 7,984,326 B2 | 7/2011 | Bland et al. | |
| 8,082,482 B2 | 12/2011 | Gower et al. | |
| 2007/0047344 A1* | 3/2007 | Thayer et al. | 365/201 |
| 2009/0083561 A1 | 3/2009 | Kaburlasos et al. | |
| 2009/0216985 A1 | 8/2009 | O'Connor et al. | |

* cited by examiner

MEMORY OPERATION OF PAIRED MEMORY DEVICES

CROSS-REFERENCE TO RELATED APPLICATION

This application is a continuation of co-pending U.S. patent application Ser. No. 13/707,675, filed Dec. 7, 2012. The aforementioned related patent application is herein incorporated by reference in its entirety.

TECHNICAL FIELD

Embodiments described herein generally relate to operation of paired memory devices, and more specifically, to operation during failure within the memory devices.

BACKGROUND

Modern computer systems, such as servers, use a packaged type of volatile memory in their main memories. The main memory is the place where the computer holds current programs and data that are in use. These programs in the main memory hold the instructions that the processor executes and the data that those instructions work with. The main memory is an important part of the main processing subsystem of the computer, tied in with the processor, cache, motherboard, and chipset allowing the computer system to function.

SUMMARY

In one embodiment, a method is provided for operation of a memory module for storage of a data word. The method includes receiving by a memory buffer a write operation request to write a data word to a memory module. The memory module may have a set of paired memory devices comprising a first memory device and a second memory device. The method may further include, determining whether any failures exist in a word section storage of the first memory device and whether any failures exist in a word section storage of the second memory device. The method may include writing a first section of the data word to the first memory device and a second section of the data word to the second memory device when no failures are found. The method may include writing the first section and second section of the data word to both the first memory device and the second memory device if either memory device has a failure in their respective word section storages so long as no failures are found in equivalent locations of word section storage in the two memory devices. The method may further include canceling the write operation request if failures in the word section storage of the first and second memory device are in equivalent locations of word section storage.

In another embodiment, an apparatus is provided for operation of a memory module for storage of a data word. The apparatus includes a memory module having a set of paired memory devices including a first memory device to store a first section of a data word and a second memory device to store a second section of the data word when used in failure free operation. The apparatus may further include a first logic module. The logic module may perform a write operation by writing the first and second sections of the data word to both the first memory device and the second memory device upon the determination of certain failures. The determination may include that a failure exists in the word section storage of either the first or second memory devices but that no failures are in equivalent locations of word section storage in the two memory devices.

DETAILED DESCRIPTION

Figure 1:
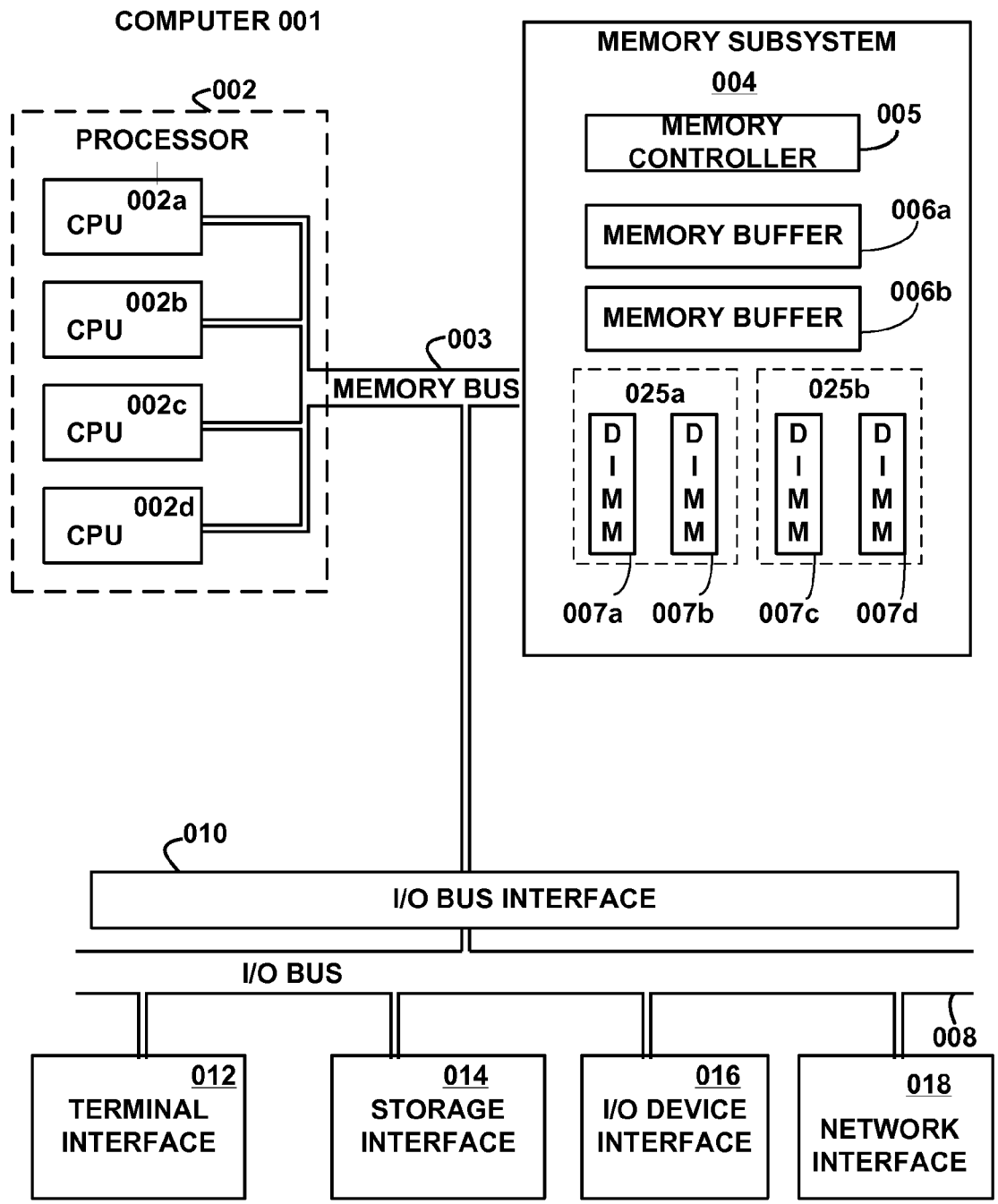
FIG. 1 depicts a high-level block diagram of an exemplary system, according to an embodiment of the invention.

FIG. 1 depicts a high-level block diagram of an exemplary system for implementing an embodiment of the invention. The mechanisms and apparatus of embodiments of the present invention apply equally to any appropriate computing system. The major components of the computer system 001 comprise one or more CPUs 002, a memory subsystem 004, a terminal interface 012, a storage interface 014, an I/O (Input/Output) device interface 016, and a network interface 018, all of which are communicatively coupled, directly or indirectly, for inter-component communication via a memory bus 003, an I/O bus 008, and an I/O bus interface unit 010.

The computer system 001 contains one or more general-purpose programmable central processing units (CPUs) 002A, 002B, 002C, and 002D, herein generically referred to as the CPU 002. In an embodiment, the computer system 001 contains multiple processors typical of a relatively large system; however, in another embodiment the computer system 001 may alternatively be a single CPU system. Each CPU 002 executes instructions stored in the memory subsystem 004 and may comprise one or more levels of on-board cache.

In an embodiment, the memory subsystem 004 may comprise a random-access semiconductor memory, storage device, or storage medium (either volatile or non-volatile) for storing data and programs. In another embodiment, the memory subsystem 004 represents the entire virtual memory of the computer system 001, and may also include the virtual memory of other computer systems coupled to the computer system 001 or connected via a network. The memory subsystem 004 is conceptually a single monolithic entity, but in other embodiments the memory subsystem 004 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory or memory subsystem 004 may contain elements for control and flow of memory used by the CPU 002. This may include all or a portion of the following: a memory controller 005, one or more memory buffers 006a and 006b, and one or more memory devices 007a, 007b, 007c, and 007d (generically referred to as 007). In the illustrated embodiment, the memory devices may be dual in-line memory modules (DIMMs), which are a series of dynamic random-access memory integrated circuits mounted on a printed circuit board and designed for use in personal computers, workstations, and servers. In various embodiments, these elements may be connected with buses for communication of data and instructions. In other embodiments, these elements may be combined into single chips that perform multiple duties or integrated into various types of memory modules. The illustrated elements are shown as being contained within the memory subsystem 004 in the computer system 001, in other embodiments some or all of them may be on different computer systems and may be accessed remotely, e.g., via a network.

Although the memory bus 003 is shown in FIG. 1 as a single bus structure providing a direct communication path among the CPUs 002, the memory subsystem 004, and the I/O bus interface 010, the memory bus 003 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 010 and the I/O bus 008 are shown as single respective units, the computer system 001 may, in fact, contain multiple I/O bus interface units 010, multiple I/O buses 008, or both. While multiple I/O interface units are shown, which separate the I/O bus 008 from various communications paths running to the various I/O devices, in other embodiments some or all of the I/O devices are connected directly to one or more system I/O buses.

In various embodiments, the computer system 001 is a multi-user mainframe computer system, a single-user system, or a server computer or similar device that has little or no direct user interface, but receives requests from other computer systems (clients). In other embodiments, the computer system 001 is implemented as a desktop computer, portable computer, laptop or notebook computer, tablet computer, pocket computer, telephone, smart phone, or any other appropriate type of electronic device.

FIG. 1 is intended to depict the representative major components of an exemplary computer system 001. But individual components may have greater complexity than represented in FIG. 1, components other than or in addition to those shown in FIG. 1 may be present, and the number, type, and configuration of such components may vary. Several particular examples of such complexities or additional variations are disclosed herein. The particular examples disclosed are for example only and are not necessarily the only such variations.

In computer systems 001, the CPU 002 requires that information be communicated to and from the CPU 002 in data words which are a designated amount of bytes and each byte may consist of 8 bits. In one embodiment, the CPU 002 requires the data word to be 128 bits in size. In another embodiment, the specific memory requirement, defined as "N", may be any amount of bits, typically a power of 2, such as 64, 128, or 256, perhaps with additional bits for error checking and correction (ECC). In another embodiment, the CPU may accept data words of several different sizes. For example, the CPU may require data words to be either 128 bits or 64 bits, accepting either when supplied. To allow this to occur with a minimum number of failures, information may pass through a memory controller 005. A memory controller 005 is a digital circuit which manages the flow of data going to and from the main memory. The memory controller 005 may be a separate chip or integrated into another chip, such as on the die of a microprocessor, which may be referred to as an integrated memory controller (IMC). In some embodiments, memory controllers 005 may be implemented on the system's motherboard or other remote location from the CPU 002. The memory controller 005 may use a memory buffer 006a or 006b which may be located within, or as a part of, the circuitry of the memory controller 005. The memory buffer 006 may also be located remotely, such as on a memory device 007, on the board containing the processor, or in a remote location accessible to the memory controller 005.

In computer system 001, a memory module 025a, that includes 1st DIMM 007a and 2nd DIMM 007b, may be operated to store the data words required by the CPU 002. In one embodiment, the CPU 002 requires the data word to be 128 bits. A memory module 025A may provide the total of 128 bits with each DIMM, 007a and 007b, providing access to 64 bits. The DIMM 007a and 007b, in this example, are an example of a memory module used in many computer applications. DIMM memory devices are often paired in computer systems to match the maximum data bandwidth the CPU can use with standard memory interfaces, thus allowing for optimized use of the CPU's processing power without having to use a non-standard computer component. The memory buffer 006 includes logic that combines the bits from the 1st DIMM 007a of 64 bits and the 2nd DIMM 007b of 64 bits to create the 128 bit data word. This assembly and operation of data bits may be used for any total N value of bits, not just 128 bits, with each memory device typically handling N/2 amount of bits.

The memory buffer 006a, in this embodiment, may be intelligent memory buffer, each of which includes an exemplary type of logic module. Such logic modules may include hardware, firmware, or both for a variety of operations and tasks, examples of which include: data buffering, data splitting, and data routing. The logic module for memory buffer 006a may control the DIMMs, 007a and 007b, the data flow between them and memory buffer 006a, and data flow with outside elements, such as the memory controller 005 or other memory buffers 006b. Outside elements, such as the memory controller 005 and other memory buffers 006b may have their own logic modules that the logic module of memory buffer 006a interacts with. In various embodiments, memory buffer 006b may have functions or logic modules for controlling DIMMs 007c and 007d similar to used by memory buffer 006a for DIMMs 007a and 007b. The logic modules may be used for failure detection and correcting techniques for failures that may occur in the DIMMs 007. Examples of such techniques include: Error Correcting Code (ECC), Built-In-Self-Test (BIST), extended exercisers, and scrub functions. The firmware or hardware may add additional sections of data for failure determination as the data is passed through the system. Logic modules throughout the system, including but not limited to the memory buffer 006, memory controller 005, and even the CPU 002 may use these techniques in the same or different forms. These logic modules may communicate failures and changes to memory usage to a hypervisor or operating system. The hypervisor or the operating system may be a system that is used to map memory in the system 001 and tracks the location of data in memory systems used by the CPU 002. In embodiments that combine or rearrange elements, aspects of the firmware, hardware, or logic modules capabilities may be combined or redistributed. These variations would be apparent to one skilled in the art.

Figure 2A:
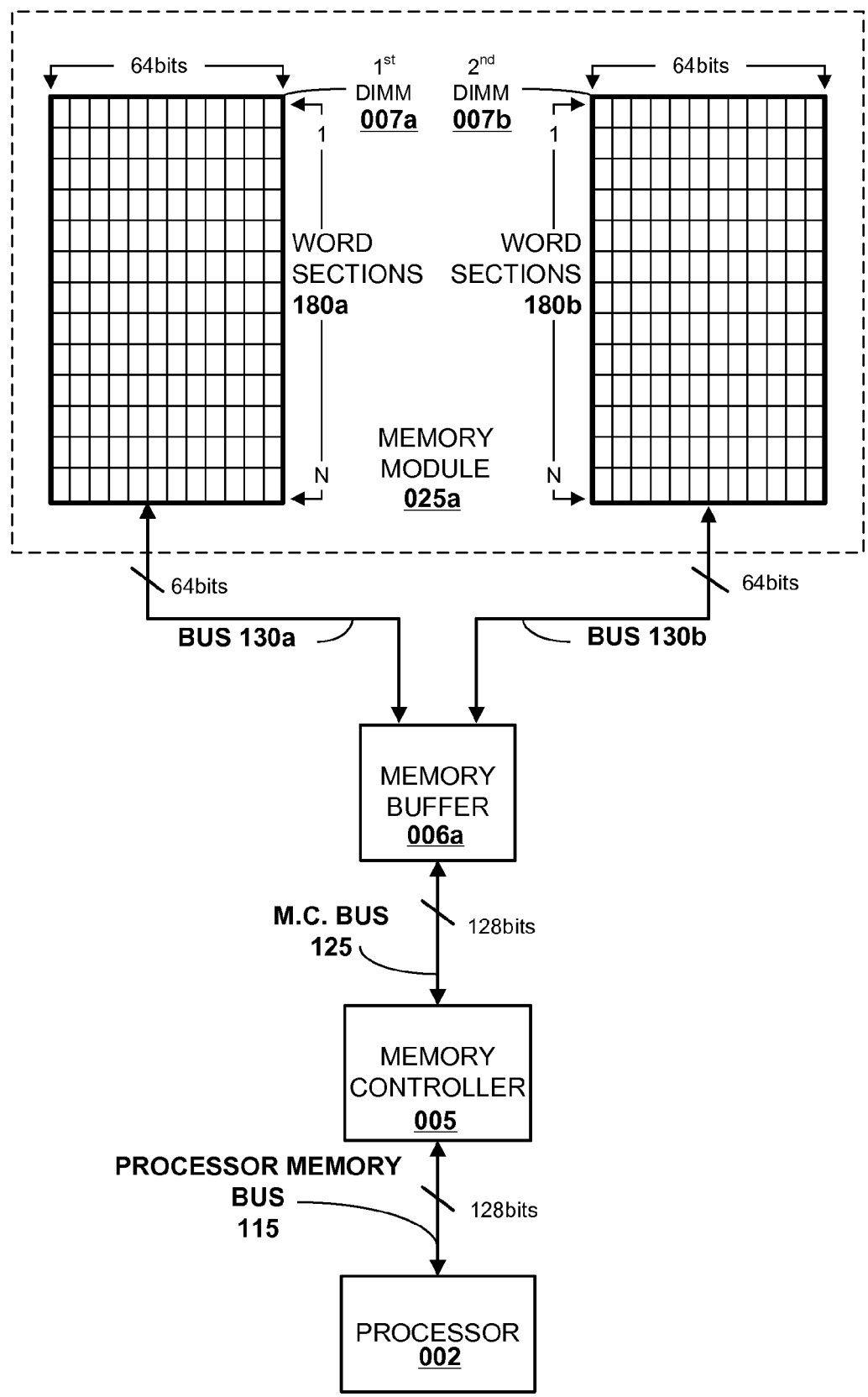
FIG. 2A is a simplified high level diagram of one embodiment of a system using dual memory units.
Figure 2B:
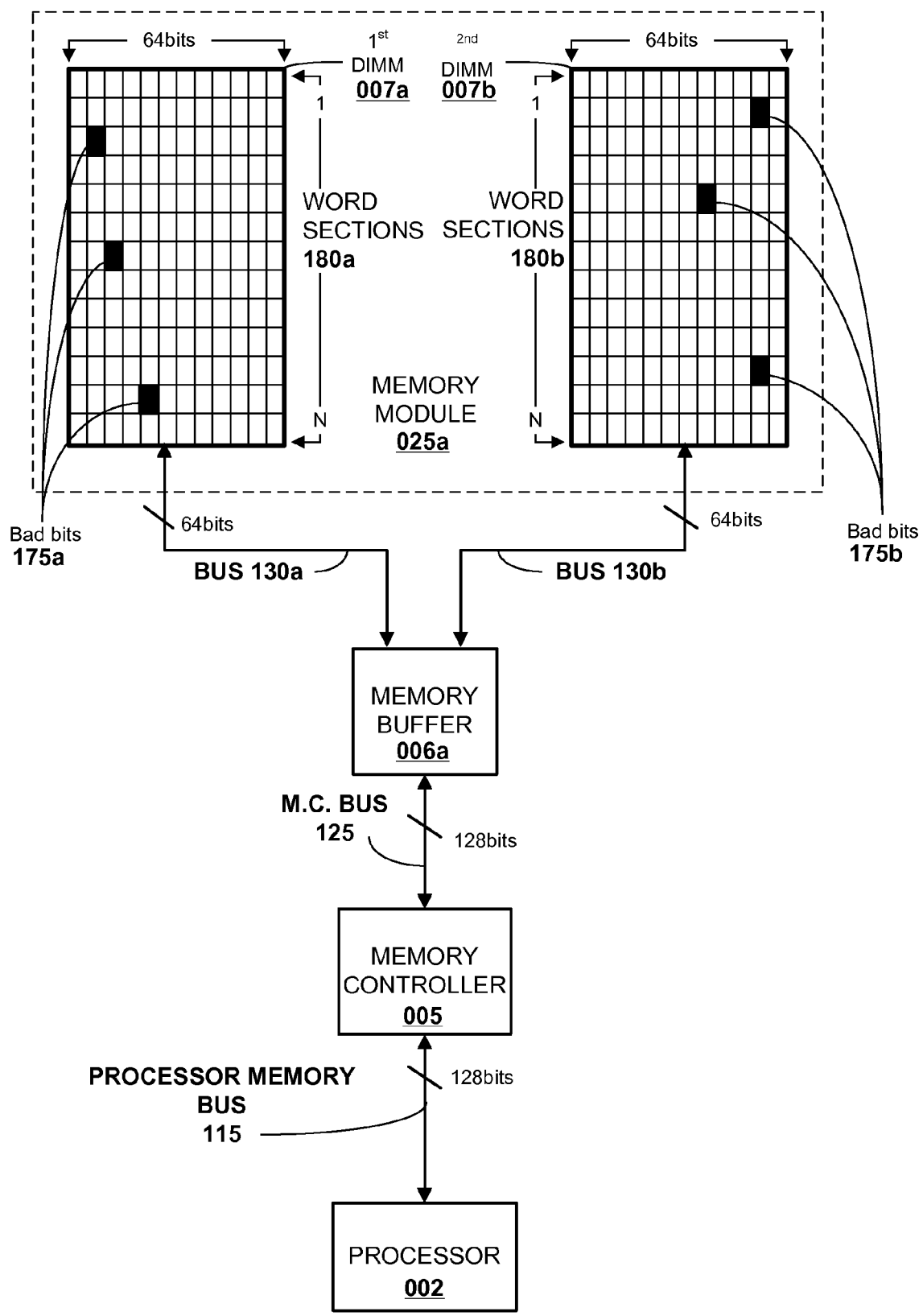
FIG. 2B is a simplified high level diagram of one embodiment of a system using dual memory units.

FIG. 2A and FIG. 2B are diagrams of memory usage that illustrate an embodiment of the invention. FIG. 2A is a diagram wherein a first memory device, 1st DIMM 007a, and a second memory device, 2nd DIMM 007b, have no failures. FIG. 2B is a diagram of the same system, wherein the 1st DIMM 007a and $2^{nd}$ DIMM 007b have failures.

In FIG. 2A, a processor 002 accesses, for either reading or writing a data word of 128 bits, a memory controller 005 through a memory bus 115. The bus sizes throughout the system may, in various embodiments, be different than the size unit of data required by various elements. For example the processor 002 may require units of 128 bytes while the memory bus may have a size, sometimes referred to as width, lanes, or wires, of only 128 bits, in such cases the transfer of the full 128 bytes required may occur over multiple bus transfer cycles. The memory controller 005, in response to the access request from the processor 002, accesses the data word through the memory buffer 006a using a memory controller bus (M.C. Bus) 125. The memory buffer 006a, if the access request is a write, splits the data word into a first and second section of 64 bits each so that it may be distributed between the 1st DIMM 007a and the 2nd DIMM 007b. The pairing of 1st DIMM 007a and 2nd DIMM 007b is referred to as a memory module 025a. The 1st DIMM 007a and 2nd DIMM 007b may have the first and second sections of the data word written to them. The 1st DIMM 007a and 2nd DIMM 007b may have a plurality of respective word section storage locations 180a and 180b, numbered 1 through N in the Figure. Under failure free operation, the first section of the data word created by the memory buffer 006a may be written to a word section storage location of the 1st DIMM 007a. The second word section may be written to an equivalent word section location on the 2nd DIMM 007b. For example, if the first section of the data word was written to the 3rd word section storage 180a of the 1st DIMM, then the equivalent storage location may be the 3rd word section storage 180b of the 2nd DIMM 007b. In various embodiments, the writing may occur sequentially or in parallel. If a read operation is requested, the memory buffer 006a reads the first and second sections of the data word, 64 bits from each DIMM, and stores it for access by the memory controller 005. In various embodiments, the reading may occur sequentially or in parallel. The memory buffer 006a and the memory module 025a are in communication using buses 130a and 130b respective to each DIMM 007a and 007b.

In FIG. 2B, a failure has occurred in the 1st DIMM 007a and $2^{nd}$ DIMM 007b, which may result in the firmware or hardware in the memory controller 005 treating the memory module 025a and memory buffer 006 as unusable. A failure may be found by ECC or similar error or failure detection. The failure may be a hard or soft failure. A hard failure may be a failure that is a permanent failure in that it may not be correctable by software, existing hardware in the electronic system, redundant systems, or time. In comparison, a soft failure is a temporary failure that may be corrected by software, existing hardware in the electronic system, redundant systems, or time. For example, a soft error may be an environmental effect that results in a temporary ionizing event. In another example, the failure may be a hard failure that can not be avoided with the use of spare bits that many memory subsystems 004 may use to handle limited failures in bits of memory devices such as the 1st DIMM 007a and $2^{nd}$ DIMM 007b. In the following it is assumed that the failure depicted in FIG. 2B is one in which the memory module 025a and memory buffer 006 were traditionally treated as unusable.

The treatment of the memory module 025a as unusable may result in inefficient operation of the memory as the still working capability of the DIMMs 007a and 007b may go unused. In this embodiment, though, when the failure occurs in either or both of the DIMMs 007a and 007b, the memory controller 005 may continue to use the memory buffer 006 and the still working word section storage locations 180a and 180b of the DIMMs 007a and 007b. This continued use may require that bad bits 175a in word section storage locations 180a in the 1st DIMM 007a do not have bad bits 175b in equivalent word section storage locations 180b of 2nd DIMM 007b. In illustrated embodiment, the 1st DIMM 007a and 2nd DIMM 007b both have respective bad bits 175a and 175b in word section storage locations 180a and 180b. However, the failures are not in equivalent locations of word section storage. The 1st DIMM 007a shown has bad bits 175a that affect word section storage for words (or locations) 3, 7, and 12. The 2nd DIMM 007b shown has bad bits 175b that affect word section storage for words (or locations) 2, 5, and 11. So long as word section storage location 180a that has a bad bit 175a does not have an equivalent word section storage location in 180b with a failure 175b, data mirrored in each may be accessible. In another type of failure, only one of the two DIMMs 007a or 007b may have bad bits 175. A logic module that is part of the memory buffer 006 allows the data word to be accessed through the DIMMs 007. In various embodiments, the logic module may be part of the memory buffer, the memory controller, the memory module, or a separate entity within the system.

In one example operation where a failure has occurred in either or both DIMMs, the memory controller 005 requests that data be accessed, either read or written, by the memory buffer 006a the same as it did prior to the failure of the 1st DIMM 007a. When the access request includes a write operation, the memory buffer 006a may, as it did previously, split the data word provided into a first and second section. Unlike the situation where no failure has occurred, the memory buffer 006a, on instruction from the logic module, sends the first data section to be written to both the 1st DIMM 007a and 2nd DIMM 007b. The data section may be written sequentially or in parallel to both the 1st DIMM 007a and 2nd DIMM 007b. In addition, the memory buffer 006 may, on instruction from the logic module, send the second data section to be written to both the 1st DIMM 007a and 2nd DIMM 007b similar to how the first section was written. Storing the first and second data sections in both DIMMs causes the data to be mirrored. The logic module may also send the second section to a different DIMM or DIMMs, for example 007c or 007d. The different DIMM or DIMMs may either be spare DIMMs in the system used in the case of failure or they may be DIMMs of another pair that may have had a similar or different failure type as DIMMs 007, such as 007c and 007d.

If the access request includes a read operation, the memory buffer 006a, at the direction of the logic module, may read the first section of the data word from either the 1st DIMM 007a or the 2nd DIMM 007b. For example, the memory buffer 006a may first attempt to read the first section from 1st DIMM 007a, but may find there is a failure in that word section storage 180a of the 1st DIMM 007a. The memory buffer may, upon finding the failure, then read the first section of the data word from the 2nd DIMM 007b which may have no failures. In one embodiment, ECC technology may be used to determine if a failure has occurred and if the read from the 2nd DIMM 007b may be required. In various embodiments, this determination may include testing or review of historical records and data gathered or available to by the system. In various embodiments, this operation may be performed by firmware, hardware, logic modules, or buses that are part of the memory system connected to the memory modules 025a, or a combination thereof. In various embodiments, the use of historical data may result in no attempt to read the word section from the 1st DIMM 007a as a failure, such as a bad bit 175a, is already known to exist. One skilled in the art will appreciate the variety of combinations that evaluating for bad bits 175 and reading a word section from the combination of DIMMS 007 may take so that the memory buffer may read the entire section of the data word.

The memory buffer 006a may then read the second section of the data word from where it may have been stored. In one embodiment, the second section of the data word may be read from either the 1st DIMM 007a or the 2nd DIMM 007b when the second section is stored in both DIMMs similarly to the first section. In another embodiment, the second section may be read from a different DIMM or DIMMs when stored there as previously mentioned. The two sections of the data word may be stored together in a data buffer so that the data word may be accessed per the read request.

In one embodiment, if the first and second sections of the data word are both stored on the 1st DIMM 007a and 2nd DIMM 007b, an open page policy may be used for faster access of the data word. The open page policy may allow for faster access of the entire data word since both sections may be stored in close proximity or locality to each other.

In various embodiments, elements may be integrated such as the memory controller 005 and memory buffer 006a may be a single integrated unit. Such embodiments may eliminate the memory controller bus 125. The actions of the elements may also be rearranged or redistributed, such as the splitting of data into sections may occur in the memory controller 005 instead of memory buffer 006a, in various embodiments. These variations would be apparent to one skilled in the art.

In various embodiments, the logic module, or modules that allow for the access may be part of the memory buffers 240, memory controller 005, the memory modules 270, or a separate entity within the system. The logic module may also reconfigure the memory usage, per various embodiments of this invention, as failures occur, moving between variations and protecting existing data as use changes. In one embodiment, the logic module may include, be part of, or have access to multiplexing capabilities. In various embodiments, elements may be integrated such as the memory controller 005, and memory buffers 006a and 006b may be a single integrated unit. Such embodiments may not require memory controller busses 225a and 225b because the function is carried out within the integrated unit. The actions of the elements may also be rearranged or redistributed, such as the splitting of data into sections may occur in the memory buffers 006a and 006b, in various embodiments. These variations would be apparent to one skilled in the art.

Figure 3A:
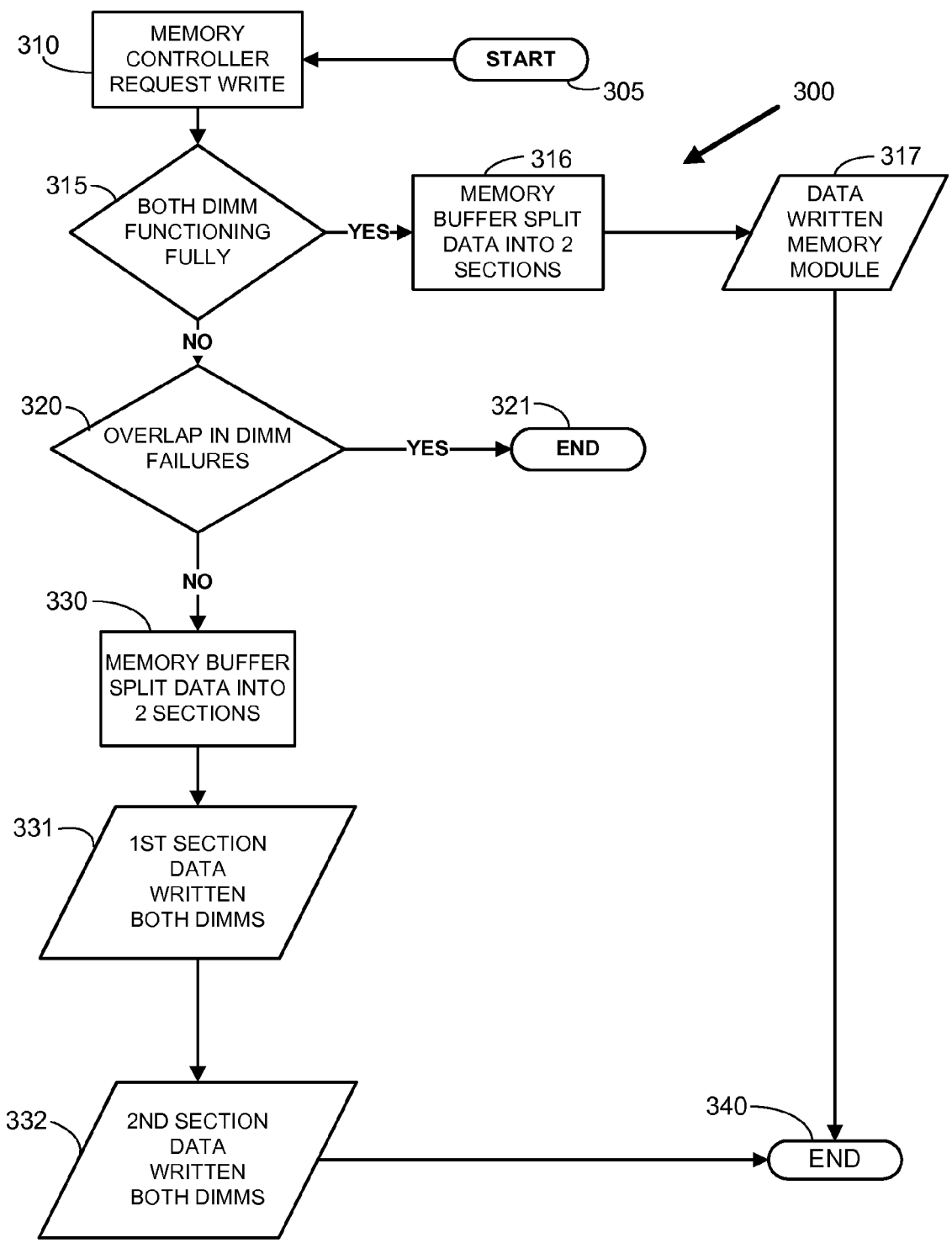
FIG. 3A is a flowchart of a method for continued operation of dual memory units upon a failure in one or more memory units, according to an embodiment of the invention.
Figure 3B:
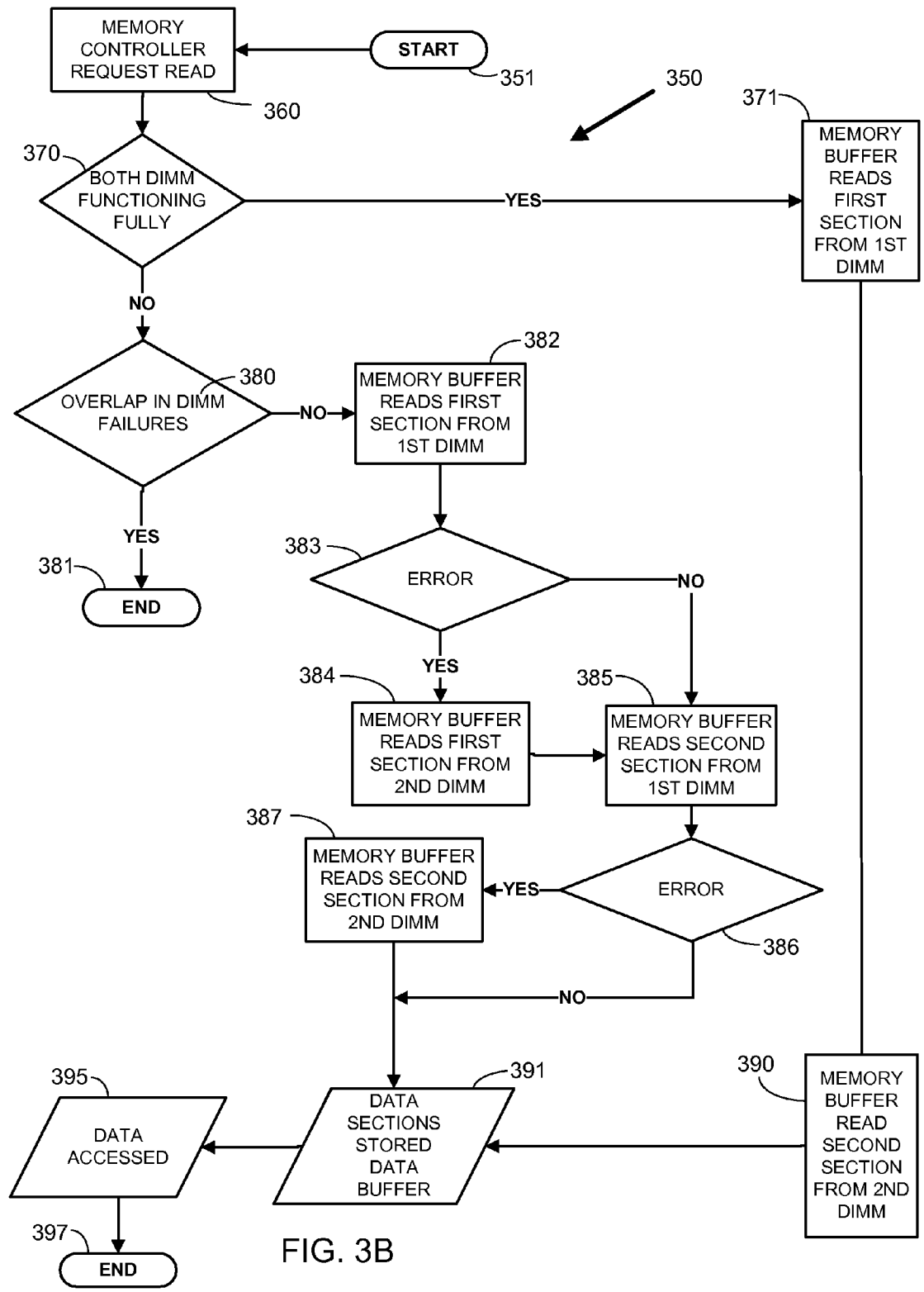
FIG. 3B is a flowchart of a method for continued operation of dual memory units upon a failure in one or more memory units, according to an embodiment of the invention.

FIGS. 3A and 3B are flowcharts of a method 300 and 350 to allow the system presented in FIGS. 3A and 3B to continue using memory devices, DIMMs 007a and 007b, when a failure occurs in one or both DIMMs 007. FIG. 3A reviews a method of handling write requests to the memory devices per an embodiment of the invention, and FIG. 3B reviews methods of handling read requests to the memory devices.

In FIG. 3A, the method 300 begins at block 305. At block 310, the memory controller 005 may request to write a data word to the first memory module 025a through first memory buffer 006. At block 315, a check may be made to see if both of a first and second memory device, e.g., the $1^{st}$ DIMM 007a and $2^{nd}$ DIMM 007b of memory module 025a are fully functioning. In various embodiments, this determination may include testing or review of historical records and data gathered or available to by the system. In various embodiments, this operation may be performed by firmware, hardware, logic modules, or buses that are part of the memory system connected to the memory modules 025, or a combination thereof. If both DIMMS 007a and 007b of the memory module 025a are functioning, the first memory buffer 006 splits the data word into a first and second data section in block 316. The data sections may then be written to the $1^{st}$ DIMM 007a and $2^{nd}$ DIMM 007b in block 317, each DIMM 007 receiving only one of the two data sections created by the first memory buffer 006 in block 316. The write action to the DIMMs 007a and 007b in block 317 may be made in parallel, thus reducing the cycle time required for the step. The process then ends at block 340.

If the check made at block 315, to see if both the 1st DIMM 007a and 2nd DIMM 007b of the memory module 025a are fully functional results in a negative answer, the method may proceed to second check at block 320. The check at block 320 determines whether there is an overlap in failures, such as bit failures 175 in equivalent locations of word section storages 180a and 180b of the respective 1st DIMM 007a and 2nd DIMM 007b. In various embodiments, this determination may include testing or review of historical records and data gathered or available to by the system. In various embodiments, this operation may be performed by firmware, hardware, logic modules, or buses that are part of the memory system connected to the memory modules 025a, or a combination thereof. If the answer is "yes" the method may proceed to block 321 where the process may end.

If the answer is "no" in block 320, then the method may proceed to block 330 where the memory buffer 006 may split the data word into a first and second data section. In block 331, the first data section is written to both the $1^{st}$ DIMM 007a and $2^{nd}$ DIMM 007b. In various embodiments, the section may be written to each DIMM 007 in sequence or parallel. In writing the data section to both the $1^{st}$ DIMM 007a and $2^{nd}$ DIMM 007b the data section is mirrored for later reading. In block 332, the method may write the second section of the data word to both the 1st DIMM 007a and 2nd DIMM 007b similar to how the first section was written. In other embodiments, the second section may be written to a different DIMM or DIMMs. The different DIMM or DIMMs, such as 007c and 007d, may either be spare DIMMs 007 in the system used in the case of failure or they may be a DIMM pair 007c and 007d of another memory module 025b that may have had a similar or different failure type to the DIMMs 007a and 007b. The process may then ends at block 340.

FIG. 3B provides a flowchart for the reading of the stored data word sections once it has been written by the method of FIG. 3A. The method 350 starts at block 351 and at block 360 the memory controller 005 may request to read the data word previously stored. In block 370, it is determined if DIMMs 007a and 007b of memory module 025 are fully functional. If the answer is "yes", the method progresses to block 371 where the memory buffer 006 reads the first section of the data word. The method may then progress to block 390 where the memory buffer 006 may read the second section of the data word. The first data section may be read from 1st DIMM 007a and the second data section read from the 2nd DIMM 007b. In various embodiments, the first and second section may be read in parallel or sequentially. In other embodiments, the first section and second sections of the data word may be split over multiple memory modules 025. In block 391, the data sections may be stored in a data buffer so that the data word may be accessed in block 395, and the method ends at block 397.

If the answer is "no", the method may progress to block 380 where method determines whether there is an overlap in equivalent bit failures 175, i.e., whether there are bit failures in equivalent locations of word section storages the 1st DIMM 007a and 2nd DIMM 007b. In various embodiments, this determination may include testing or review of historical records and data gathered or available to by the system. In various embodiments, this operation may be performed by firmware, hardware, logic modules, or buses that are part of the memory system connected to the memory modules 025, or a combination thereof. If the answer is "yes" the method may proceed to block 381 where the process may end.

If the answer is "no" in block 380, then the method may proceed to block 382 where the memory buffer 006 may attempt to read the first section of the data word from the 1st DIMM 007a. In block 383, the method determines if there is a failure in the first section of the data word contained in the 1st DIMM 007a. In various embodiments, this determination may include testing or review of historical records and data gathered or available to by the system. In various embodiments, this operation may be performed by firmware, hardware, logic modules, or buses that are part of the memory system connected to the memory modules 025, or a combination thereof. If the answer is "no" then the read of the first section from the 1$^{st}$ DIMM 007a may be completed and the method may proceed to block 385. If the answer is "yes" in block 383 the method may proceed to block 384 where the first section of the data word may be read from the 2nd DIMM 007b instead of the 1st DIMM 007a. The method may proceed to block 385 when the read of the first section of the data word is complete in either block 383 or block 384.

In block 385, the memory buffer 006 may attempt to read the second section of the data word from the 1st DIMM 007a. In block 386, the method determines if there is a failure in the second section of the data word contained in the 1st DIMM 007a. In various embodiments, this determination may include testing or review of historical records and data gathered or available to by the system. In various embodiments, this operation may be performed by firmware, hardware, logic modules, or buses that are part of the memory system connected to the memory modules 025, or a combination thereof. If the answer is "no" then the read of the second section from the 1$^{st}$ DIMM 007a may be completed and the method may proceed to block 391. If the answer is "yes" in block 386 the method may proceed to block 387 where the second section of the data word may be read from the 2nd DIMM 007b instead of the 1st DIMM 007a. The method may proceed to block 391 when the read of the first section of the data word is complete in either block 385 or block 387. In block 391, the data sections may be stored in a data buffer so that the data word may be accessed in block 395, and the method ends at block 397.

In alternate embodiments, the first section and second sections of the data word may be split over multiple memory modules 025. In various embodiments, the second section may be read from a different DIMM or DIMMs using various methods of accessing it that may or may not be similar to the method used for the first section of the data word. The different DIMM or DIMMs may either be spare DIMMs in the system used in the case of failure or they may be DIMMs of another pair that may have had a similar or different failure type as DIMMs 007. In various embodiments, the first and second section may be read in parallel or sequentially.

In various embodiments, elements may be integrated such as the memory controller 005 and memory buffers 006 may be a single integrated unit. This variation in elements may result in rearranging or redistributing where various steps of the method may be performed. In other embodiments, tasks may be redistributed between elements. An example of this is the splitting of data into sections; this may occur in the memory controller 005 or in the memory buffer 006 in various embodiments. These variations would be apparent to one skilled in the art.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. A memory system, comprising;
a memory module, the memory module having a set of paired memory devices comprising a first memory device to store a first section of a data word and a second memory device to store a second section of the data word in failure free operation; and
a first logic module to:
determine whether a failure exists in the word section storage of either the first or second memory devices,
write a first section of the data word to the first memory device and a second section of the data word to the second memory device when no failures are found,
write the first section and second section of the data word to both the first memory device and the second memory device if either memory device has a failure in their respective word section storages so long as no failures are determined to be in equivalent locations of word section storage in the first and second memory devices.

2. The memory system of claim 1, wherein the first and second memory devices are dual in-line memory modules (DIMMs).

3. The memory system of claim 1, wherein the first logic module is part of the memory buffer.

4. The memory system of claim 1, wherein the first logic module is operable to:
receive a read operation request to read the data word from the memory module when the first and second sections of the data word have been stored on the both the first and second memory devices of the memory module,
determine whether the word storage section of the first memory device containing the first section of the data word has any failures,
read the first data section of the data word from the first memory device if the word storage section of the first memory device containing the first section of the data word is determined to not have any failures,
read the first section of the data word from the second memory device if the word storage section of the first memory device containing the first section of the data word is determined to have any failures,
determine whether the word storage section storage containing the second section of the data word in the first memory device has any failures,
read the second data section of the data word from the first memory device if the word storage section containing the second section of the data word is determined to not have any failures, and
read the second section of the data word from the second memory device if the word storage section of the first memory device containing the second section of the data word is determined to have any failures.

5. The memory system of claim 4, wherein the second logic module is part of the memory buffer.

6. The memory system of claim 4, further comprising: a data buffer adapted for use by the memory buffer for storing the first and second sections of the data word when read from either of the first and second memory devices.

* * * * *